United States Patent [19]

Aichelmann, Jr.

[11] Patent Number: 5,150,328
[45] Date of Patent: Sep. 22, 1992

[54] MEMORY ORGANIZATION WITH ARRAYS HAVING AN ALTERNATE DATA PORT FACILITY

[75] Inventor: Frederick J. Aichelmann, Jr., Hopewell Junction, N.Y.

[73] Assignee: International Business Machines Corporation, Armonk, N.Y.

[21] Appl. No.: 262,560

[22] Filed: Oct. 25, 1988

[51] Int. Cl.$^5$ .................................................. G11C 7/00
[52] U.S. Cl. ............................ 365/189.03; 395/400; 395/425; 364/DIG. 2; 364/926.92; 364/948.1; 364/949.4; 364/965.9; 364/965; 364/965.8
[58] Field of Search ... 364/200 MS File, 900 MS File; 365/155, 154, 189.03, 189.04, 189.02; 395/400, 425

[56] References Cited

U.S. PATENT DOCUMENTS

| | | | |
|---|---|---|---|
| 4,020,466 | 4/1977 | Cordi et al. | 340/172.5 |
| 4,028,675 | 6/1977 | Frankenberg | 340/172.5 |
| 4,112,506 | 9/1978 | Zibu | 365/181 |
| 4,125,877 | 11/1978 | Reinert | 365/190 |
| 4,349,870 | 9/1982 | Shaw et al. | 364/200 |
| 4,394,726 | 7/1983 | Kohl | 364/200 |
| 4,395,765 | 7/1983 | Moffitt et al. | 365/174 |
| 4,410,964 | 10/1983 | Nordling et al. | 365/189 |
| 4,443,845 | 4/1984 | Hamilton et al. | 364/200 |
| 4,443,864 | 4/1984 | McElroy | 364/900 |
| 4,489,381 | 12/1984 | Lavallee et al. | 364/200 |
| 4,491,937 | 1/1985 | Chan | 365/154 |
| 4,535,427 | 8/1985 | Jiang | 365/205 |
| 4,541,076 | 9/1985 | Bowers et al. | 365/190 |
| 4,554,645 | 11/1985 | Furman | 365/189 |
| 4,573,116 | 2/1986 | Ong et al. | 364/200 |
| 4,577,292 | 3/1986 | Bernstein | 365/189 |
| 4,580,245 | 4/1985 | Ziegler et al. | 365/154 |
| 4,586,168 | 4/1986 | Adlhoch et al. | 365/189 |
| 4,623,990 | 11/1986 | Allen et al. | 365/189 |
| 4,627,030 | 12/1986 | Barber | 365/189 |
| 4,633,330 | 12/1986 | Pakulski | 365/189 |
| 4,633,441 | 12/1986 | Ishimoto | 365/189 |
| 4,649,475 | 3/1987 | Scheuneman | 364/200 |
| 4,663,741 | 5/1987 | Reinschmidt et al. | 365/189 |
| 4,694,394 | 9/1987 | Costantini | 364/200 |
| 4,706,217 | 10/1987 | Shimizu et al. | 365/154 |
| 4,718,039 | 1/1988 | Aichelmann, Jr. et al. | 364/900 |
| 4,719,601 | 1/1988 | Gray et al. | 365/210 |
| 4,731,758 | 3/1988 | Lam et al. | 365/189 |
| 4,742,493 | 5/1988 | Lewallen et al. | 365/230 |
| 4,845,660 | 7/1989 | Luc et al. | 364/900 |

FOREIGN PATENT DOCUMENTS 0120525  3/1984  European Pat. Off. .

OTHER PUBLICATIONS

IEEE Journal of Solid-State Circuits, vol. SC-16, No. 5, Oct. 6, 1981, New York, pp. 479-487; Reese et al., "A 4K×8 Dynamic RAM with Self Refresh".
Electronic Design, vol. 33, No. 14, Jun. 13, 1985, pp. 171-174, Linden et al., "'Keep It Simple' Is 1-MBit ROM's Motto for MP Interfaces".
Intel *Embedded Controller Handbook*, pp. 16-31 to 16-37, Dec. 1986 "8155h/8156H/8155H-2/8156H-2 2048-Bit Static HMOS RAM With I/O Ports and Timer".
Texas Instruments' *TTL Data Book*, vol. 2, pp. 3-1021 to 3-1025 (1985) product descriptions for "Types SN54LS373, SN54LS374, SN54S373, SN54S374, SN74LS373, SN74LS374, SN74S373, SN74S374 Octal D-Type Transparent Latches and Edge-Triggered Flip-Flops".

*Primary Examiner*—Kevin A. Kriess
*Attorney, Agent, or Firm*—Donald M. Boles

[57] ABSTRACT

A memory organization having one or more groups of memory arrays is disclosed. Each array, which may be on a single chip, is provided with both a data port and a separate address port which may also serve as an alternate data port. Use of the alternate data ports permits a substantially smaller number of input/output circuits to be used than the number required if both the address and data ports are used. The standard data port is, however, available should a higher-speed application be desired using separate address and data ports. In a single-port application, an on-chip data buffer permits the data to be sent and received through the address port in timed relationship with row and column address signals and without interfering with such address signals. An optional group select signal permits a large memory organization to utilize the alternate data ports of numerous groups of array chips.

11 Claims, 7 Drawing Sheets

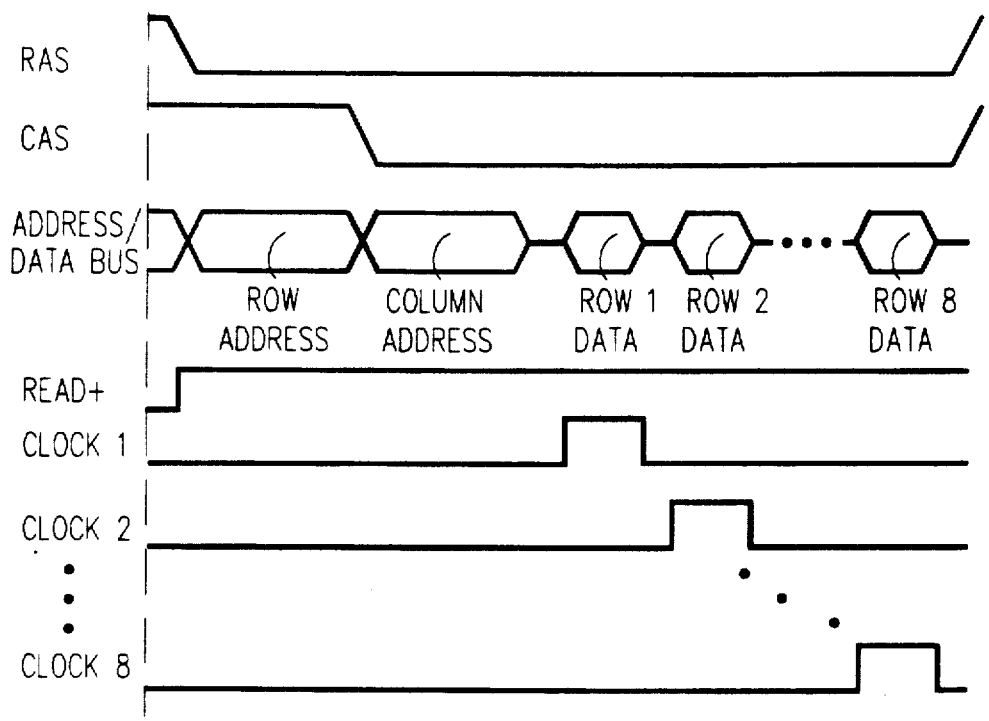
FIG. 9  ("FETCH")
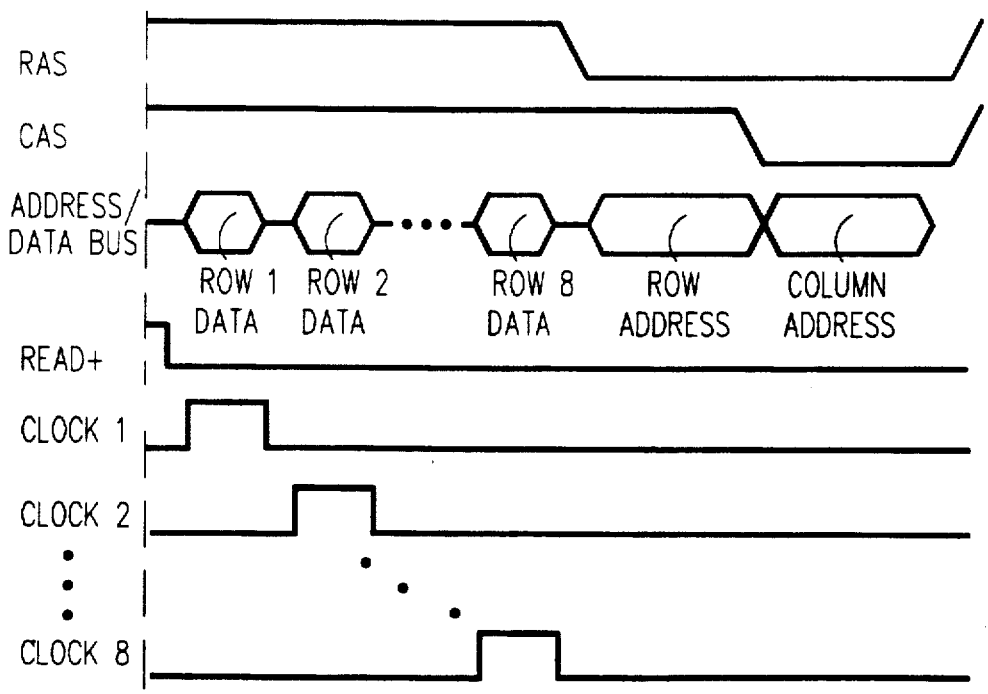
FIG. 10  ("STORE")

MEMORY ORGANIZATION WITH ARRAYS HAVING AN ALTERNATE DATA PORT FACILITY

BACKGROUND OF THE INVENTION

The present invention relates to a memory organization and more particularly to an organization of memory elements or arrays, each array having both a standard data port and an alternate data port, to increase design flexibility. The standard port is available in the event the array is intended for high-end applications where speed is of paramount importance, and the alternate port is available in the event the array is intended for low-end applications where cost is of paramount importance. The memory array design of the present invention utilizes a special buffer associated with each array to permit the address port of each memory array element or chip to function as an alternate data port for the array, thereby reducing the number of external input/output (I/O) circuits required for communication with each array. The standard data port is not affected.

In most typical data processing applications, the memory unit communicates with a separate data processing unit through various buses or lines, such as the prior art block diagram arrangement of FIG. 1. In this simplified illustration, memory system 10 communicates with separate processor 11 through an address bus and a data bus. Each bus typically contains a number of lines equal to the number of bits in each address word or data word. Various control and power lines (not shown) may also be present.

Conventional random access memory (RAM) designs employ one or more memory chips or arrays of cells. Each array typically will have an address port through which the address lines from the processor pass, and a separate data port through which the data lines pass. Separate ports are normally required because of the need to decode address words but not data words, and the possibility of interference if address and data words are both transmitted through the same port.

Dual port and multiple port memories are known. See, e.g., U.S. Pat. Nos. 4,541,076; 4,410,964; 4,633,440; 4,491,937; and 4,718,039. The memory designs of these patents permit data to be read into or out of the memory array through more than one port. However, separate address ports must still be provided for the address information. In addition, merely increasing the number of ports through which information may pass creates certain problems. For example, for each additional port, additional I/O circuitry typically must also be provided both in the array and in the processor or external support logic circuitry to act as interface devices to facilitate the transfer of data or address information back and forth through the additional port. Each additional I/O circuit, of course, adds to the complexity and cost of the memory and support circuitry, and also requires more power, generates more heat, takes up more chip space and reduces reliability.

Aside from the problems caused by additional I/O circuits, there are other design and manufacturing considerations that also arise when considering the number of address and/or data ports to provide for each array. Because of the increasing complexity with each new generation of memory chip, it is desirable to have as few different designs as possible to minimize design costs. A standard or uniform chip usable for a wide variety of applications, both high-end and low-end, would be highly desirable. If the same memory chip could be used in both a low-cost, relatively-low speed data processing product and in a higher cost but higher speed product, great savings and design flexibility could be achieved.

In order for a given memory chip to be as versatile as possible, it will, of course, need to be designed to handle the highest speed envisioned for its particular range of applications. Thus, the I/O circuitry and data port should be designed to handle high-speed data transfer to and from the array of memory cells, and the address port should be designed to handle high-speed addressing of the greatest number of cells expected to be needed for the range of applications. For large arrays, this usually means that more address lines than data lines should be provided, thus requiring at least two separate ports, one for address and one for data.

Although such a design is suitable for high-speed applications, where a large number of I/O circuits may be an acceptable trade-off to achieve speed, it is less suitable for low-cost applications where the cost of additional I/O circuits to support separate or additional ports would not be justified. Because of this, it is desirable to have a memory circuit or chip with the capability of being easily adapted for either high-speed or low-cost applications. In particular, it would be desirable to be able to use the same memory chip for either a two-port application or a single-port application. For example, if one port could be used for both data and address information, conventional address I/O circuits could also handle the data, eliminating the need for additional I/O circuits dedicated to the data port for low-cost applications. The combined address/data port should not, however, interfere with the data port or otherwise adversely affect chip performance, to permit the dedicated data port to be used for high-speed applications. The present invention accomplishes these objectives through the use of a special on-chip data buffer that permits the address port to operate both as an address port and as an alternate data port.

In U.S. Pat. No. 4,694,394, there is disclosed a microprocessor system having a multiplexed address/data bus. This patent shows a combined address/data bus entering what appears to be an address/data port in "circuit block 2". This element is further identified in the specification as being a commercial integrated circuit containing a RAM manufactured by Intel Corp., identified by the code "8155." Little additional structure or function, however, is disclosed either in the patent or in the available literature for this Intel product. For example, the Intel 1988 *Embedded Controller Handbook*, pp. 16–31 to 16–37 (copyright 1987), describes the product as having a static RAM array, several I/O ports, a multiplexed address and data bus, a timer and an address latch. It does not appear, however, that this product contains two different data ports suitable for use in both high-end and low-end applications. In addition, there is no disclosure of a data buffer.

U.S. Pat. No. 4,443,864 discloses a memory system having a multiplexed address/data bus. The bus of this patent, however, requires a certain number of dedicated address lines. In addition, there is no disclosure of a separate data port permitting the memory array to function in widely varying application.

In U.S. Pat. No. 4,491,937, a multiple port storage array is disclosed, having multiple write ports and multiple read ports. The row address lines or column address lines may also be used to carry data. U.S. Pat. No. 4,443,845 discloses a memory system having a "common interface." The device of this patent shows a memory connected to a processor with a "common bus" which carries address, data and control signals. The above two patents do not, however, disclose data buffers or alternate data ports permitting the memory to operate in both high-end and low-end applications. The present invention is intended to remedy the above-mentioned omissions and disadvantages of the prior art and provide a memory capable of being adapted for use in a wide variety of applications. More particularly, the present invention relates to a memory chip having both a standard data port, suitable for normal or high-speed use, and a separate address port which may double as an alternate data port, suitable for use in low-cost, lower speed applications where the number of external I/O circuits is to be kept to a minimum. When the alternate data port is used, more performance may be obtained from existing address line I/O circuits. Data is kept from interfering with the address signals and vice versa by way of a special data buffer located on the memory chip, operating with timing signals. The data buffer serves to latch, gate and drive the data signals to and from the memory array through the address port. A type of "triplexing" is achieved on the address lines in that column address, row address and data signals are all transmitted over the same lines and through the address port in proper timed relationship with each other so as to avoid mutual interference. This permits the memory chip to function either as a single-port chip or as a dual-port chip.

SUMMARY OF THE INVENTION

Briefly, the present invention relates to a memory comprising at least one memory array, each array having a data port through which data signals may pass to and from the array, and an address port through which row and column address signals may pass to the array, the address port being wider than the data port; and means associated with the array for actuating the address port to permit data signals to pass to and from the array through the address port in timed relationship with the address signals and without interfering with such address signals, so as to provide an alternate data port for the array.

In a preferred embodiment of the present invention, the means for actuating the address port comprises a data buffer coupled to and between the address port and the array. The data buffer may, in one embodiment, comprise a plurality of logic circuits performing latching, gating and driving functions for the data signals in response to control signals for directing the data signals to and from the array and through the address port in timed relationship with the row and column address signals.

In a further embodiment, the present invention comprises a memory circuit comprising an array of memory cells; row and column address decoders coupled to the array and suitable for sending row and column address information to the array; data sense amplifiers coupled to the array and suitable for sending and receiving data to and from the array; data lines coupled to the sense amplifiers; a data input/output interface coupled to the data lines and suitable for sending and receiving data signals to and from external circuitry through a dedicated data port; address lines coupled to the address decoders, suitable for receiving address signals from external circuitry through an address port, the number of address lines being greater than the number of data lines; and a bidirectional data buffer coupled to and situated between the address lines and the data lines, arranged to permit the address port to function both as an address port and as an alternate data port capable of passing data words having a larger number of bits than data words passable through the dedicated data port, and suitable for blocking, sending and receiving data signals to and from external circuitry over the address lines in timed relationship with the row and column address signals, in response to control signals.

BRIEF DESCRIPTION OF THE DRAWINGS

FIG. 9 is a timing diagram of the operation of the memory chip group of FIG. 6 in the "fetch" or "read" mode.

FIG. 10 is a timing diagram of the operation of the memory chip group of FIG. 6 in the "store" or "write" mode.

DETAILED DESCRIPTION OF THE PREFERRED EMBODIMENTS

Figure 2:
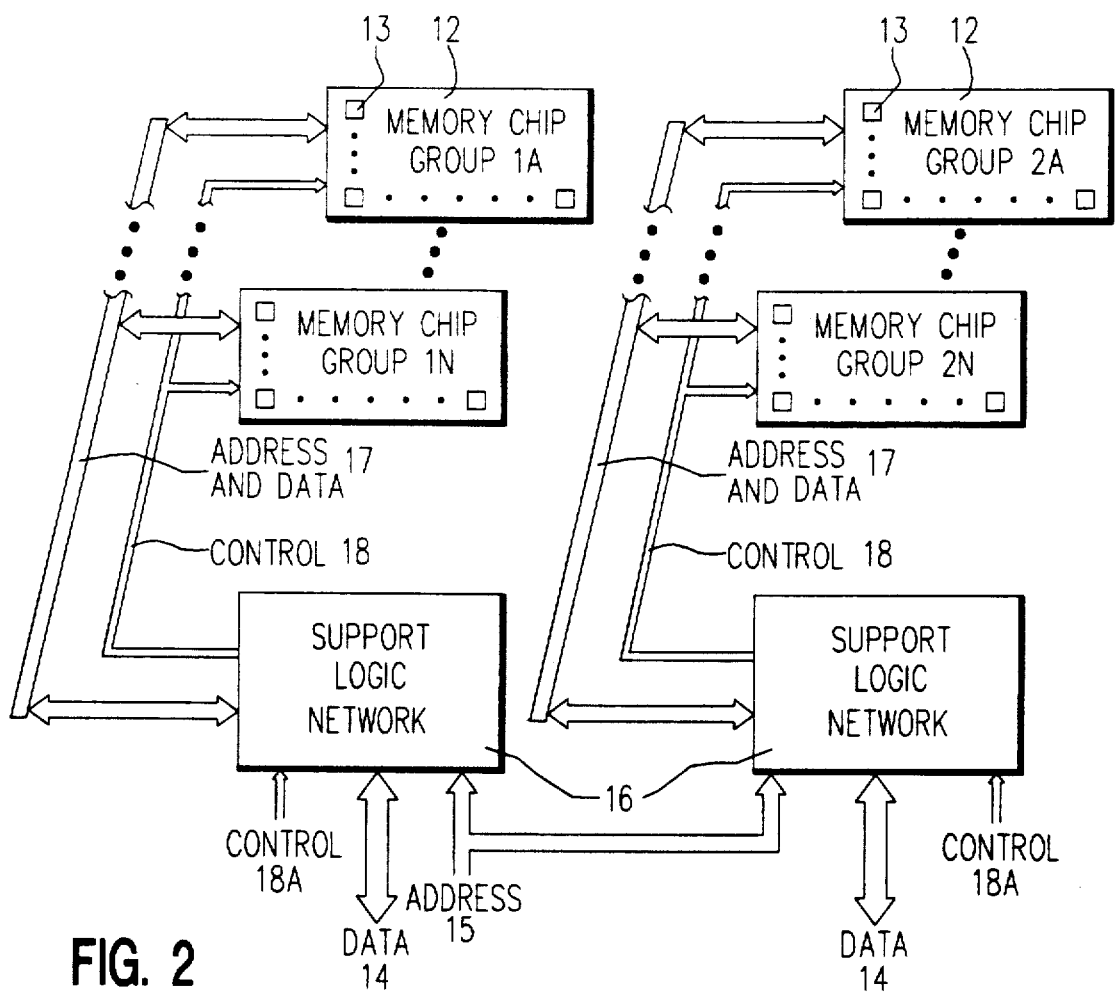
FIG. 2 is a block diagram of the overall memory organization of the present invention.

Referring now to FIG. 2, there is shown therein a block diagram of one embodiment of the present invention. The present invention is not, however, limited to the particular configuration shown in FIG. 2 or in any other figure.

In FIG. 2, a large memory organization is illustrated. The memory is arranged into one or more groups 12 of individual memory arrays 13. Each memory array may be formed on a separate integrated circuit or chip, and may comprise an array of dynamic random access memory (DRAM) cells, although other types of cells could also be used, such as static RAM, read-only memory (ROM), etc. The chips of each group receive address and data signals over a common address and data bus 17 from one or more support logic networks 16. Data is also transmitted from the chips to networks 16 through this bus. In addition, the memory chips of each group receive various control signals through a common control bus 18 from networks 16. Control bus 18 may carry one or more control signals to the memory chips to initiate memory read, memory write, row addressing and column addressing operations. An optional "group select" or "output enable" (OE*) signal may also be transmitted over this bus, as well as clock or other signals.

Each support logic network 16 may be a conventional network of combinatorial logic circuits, and may be located on a memory card together with one or more of the memory chip groups 12, although each network 16 will not typically be located on the same individual integrated circuit chip as any of the memory arrays 13. Network 16 receives data signals through a data bus 14, address signals through an address bus 15, and control signals through a control bus 18A from processor means (not shown) external to the memory.

The memory organization of FIG. 2 may be utilized to transfer information to and from various groups of the memory chips either serially or in parallel. For example, the memory chip groups labelled 1A and 2A could be addressed simultaneously for the reading or writing of data from all of the chips in a particular row of both groups at the same time. In such a case, an extremely wide data word (i.e., having an extremely large number of bits) could be handled, if desired. By arranging the individual memory chips 13 within each group 12 in the form of an array, and in arranging all of the groups 12 into a larger array, a high data transfer rate over the address and data bus 17 may be achieved. In this particular arrangement, for example, a row of chips in groups 1A, 2A (and perhaps others) could be read or written into at a time $T_1$. At a time $T_2$, which could be the next memory cycle sequenced by a clock signal over control bus 18, all of the chips in the next row of groups 1A, 2A, etc., could be accessed in similar fashion, and so on down to groups 1B, 2B, etc., and then down to groups 1N, 2N, etc. There is virtually no limit to the number of groups which may be organized in this fashion.

A feature of the present invention is the use of the address and data bus 17 for the reading and writing of data. From FIG. 2, it can be seen that only one data input/output (I/O) port is required in the support logic network 16. Nevertheless, a large memory organization of numerous chips and able to handle wide data words may be built using the single I/O port in this manner. Such a feature allows the memory cost to be reduced because separate I/O ports, and their associated I/O circuits, are not required for both data and addresses. The memory remains, however, able to store large quantities of data and to input and output wide data words.

Figure 3:
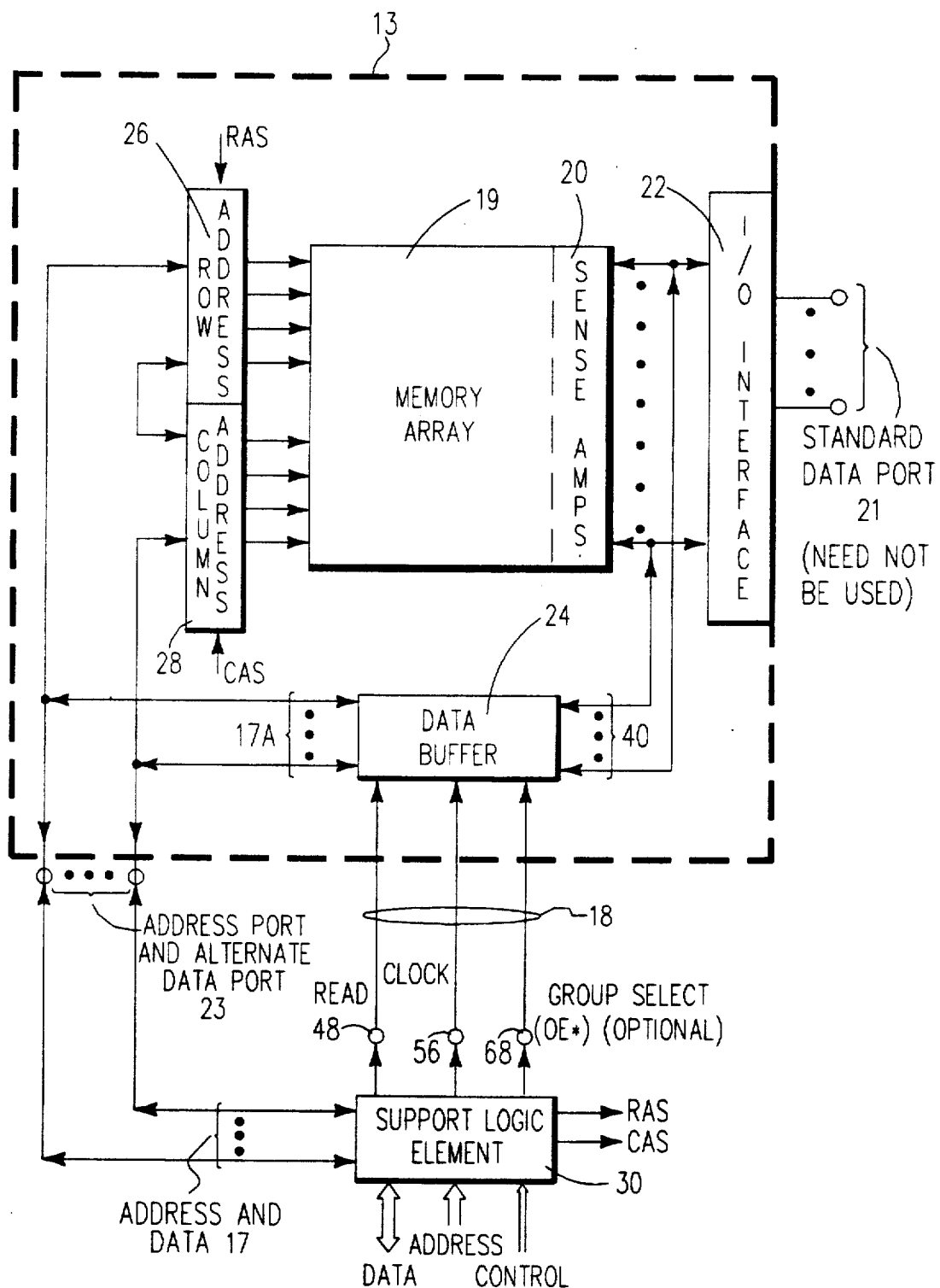
FIG. 3 is a block diagram of an individual memory chip of the present invention.

Turning to FIG. 3, there is illustrated therein the internal structure in block diagram form of an individual memory array chip 13 of FIG. 2. In a preferred embodiment, memory chip 13 contains one or more memory arrays 19 together with one or more data sense amplifiers 20, one or more row address decoders 26 and one or more column address decoders 28 communicating directly with array 19. Each memory array 19 may be an array of conventional DRAM or other cells arranged in rectangular (row and column) format and addressed by decoders 26 and 28. Sense amps 20 provide data amplification functions for data signals being written into or read out of array 19. Address decoders 26 and 28 are coupled to an address port 23 by way of address lines 17. Row and column address signals are applied to the array and decoders over lines 17 through port 23 from support logic element 30.

Memory chip 13 is also provided with an I/O data interface circuit 22 coupled to a data port 21 and communicating with sense amps 20 through data lines 40. Data signals may flow to and from memory array 19 through sense amps 20 over data lines 40 from I/O interface 22 and data port 21 in bidirectional fashion. Typically, there may be fewer data lines 40 than address lines 17. Memory chip 13 is provided with the data port 21 in the event that the memory chip is desired to be used in a high-speed application, where external I/O circuits dedicated to this data port are provided. Data port 21, however, need not be used. Instead, in a feature of the present invention, data may be read into and out of the memory chip 13 through the address port 23 of the memory chip. In this way, the address port may also serve as an alternate data port for the memory array chip.

Support logic element 30, which may be of conventional combinatory logic design, receives data signals, row and column address signals and control signals from an external processor (not shown). Support logic element 30 contains a conventional I/O circuit coupled to the address (and alternate data) lines 17. Such an I/O circuit may be designed to handle the input/output functions for the row address signals, column address signals and data signals to be transmitted through port 23 over lines 17. In this way, the row address signals, column address signals and data signals may, in effect, be "triplexed" into lines 17 for transmittal to memory chip 13. This permits the single port 23 and the single external I/O circuit in support logic element 30 to handle three types of information—row address signals, column address signals and data signals.

In this configuration, it can be seen that the standard data port 21 need not be used at all for any transmission of data to or from the memory chip 13. This avoids the need for a second I/O circuit in the support logic element 30 or in the processor, thus reducing the number of I/O circuits by one-half. The memory chip of the present invention does, however, have the standard data port 21 available for use to provide increased flexibility of memory design. Chip 13 could, for example, be used either in a dual port memory, where additional I/O circuits for both the address port and the data port are provided to accomplish higher speeds, or in a single port memory, where cost is of the paramount importance.

In a single port application, where both address and data must be read into and out of the array through the same port 23, means must be provided for preventing the data and address signals from interfering with each other, for removing data from the stream of address and data signals entering port 23 on lines 17 during a write operation, and for inserting data signals into this stream of signals during a read operation. The proper timing of this triplexed information is critical.

The present invention accomplishes these objectives by way of a data buffer 24. In a preferred embodiment, buffer 24 is located on the same memory chip 13 as the array 19, the sense amps 20, the decoders 26 and 28, and the I/O interface 22. Data buffer 24 is coupled to the address lines 17 via buffer lines 17A, and to the sense amps 20 and array 19 via data lines 40. The number of buffer lines 17A could be fewer than or equal to the number of address lines 17. The data buffer also receives control signals from support logic element 30 through control lines in control bus 18. Control lines are also provided to the row address decoder 26 and the column address decoder 28 from element 30 to provide row address strobe (RAS) and column address strobe (CAS) signals.

Data buffer 24 accomplishes all of the functions necessary to extract data information from the address lines 17 and to forward it to the sense amps for writing into the memory array, and for accepting data signals read from the memory array for transmission back onto the address lines 17 for reading out of the memory chip 13 through port 23. These operations of the data buffer are controlled by control signals received over control lines 18 from support logic element 30. In a preferred embodiment, a READ control line 48 and a CLOCK control line 56 are both input to the buffer. In addition, an optional GROUP SELECT or OUTPUT ENABLE (OE*) control line 68 is also provided. The binary signal in the READ line 48 controls both the reading of data from the memory array 19 and (via the signal complement) the writing of data into the array. A binary signal on the CLOCK line 56 synchronizes the memory read and write cycles and helps maintain the proper timing relationship of all the signals passing through port 23. One or more binary signals on the GROUP SELECT line 68 selects the particular group with which the memory chip 13 is associated and may also be used for memory interleaving. These READ, CLOCK and GROUP SELECT signals may be generated by circuitry either in support logic element 30 or in the external processor (not shown).

Figure 4:
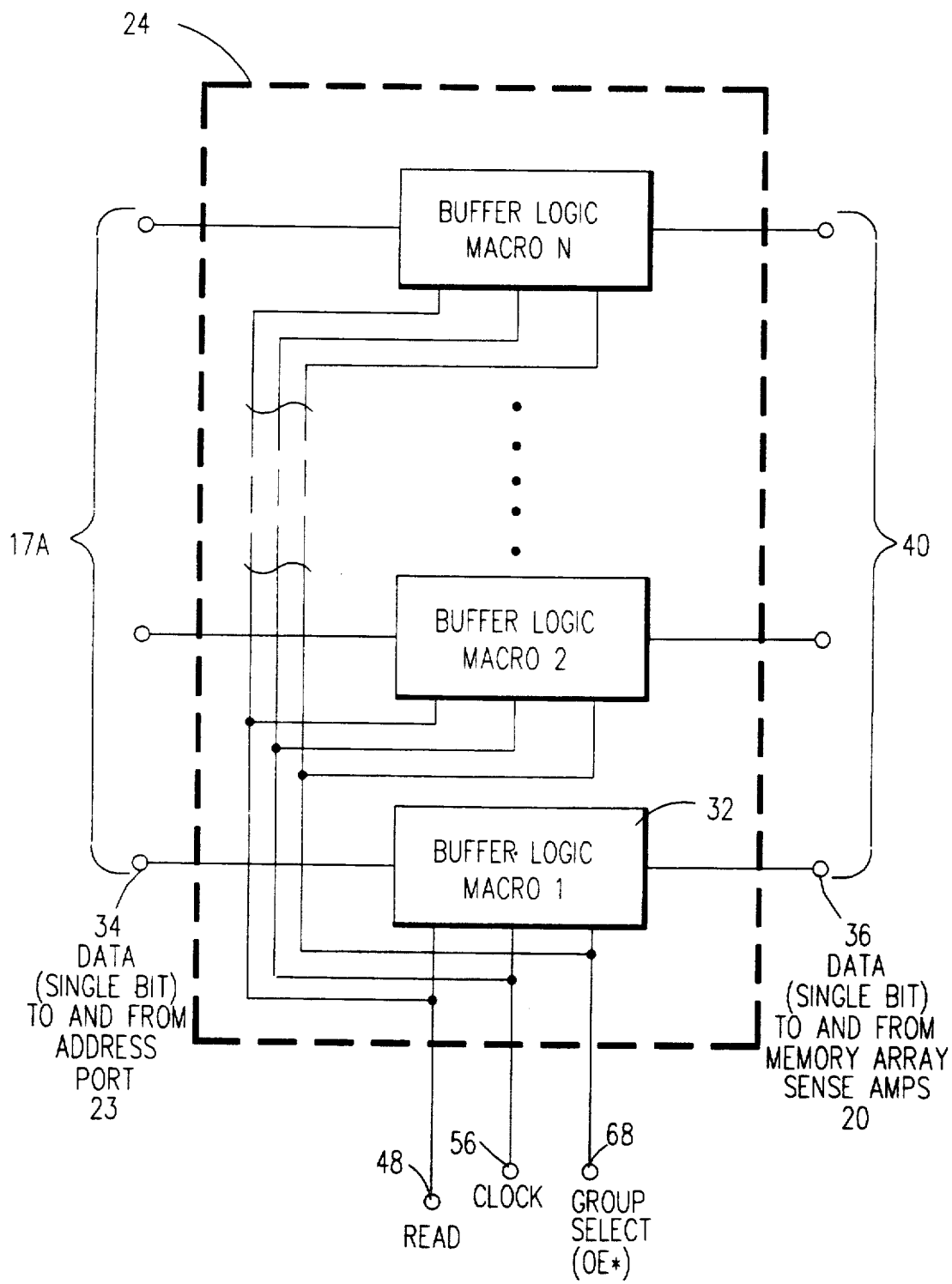
FIG. 4 is a block diagram of data buffer 24 of FIG. 3.
Figure 5:
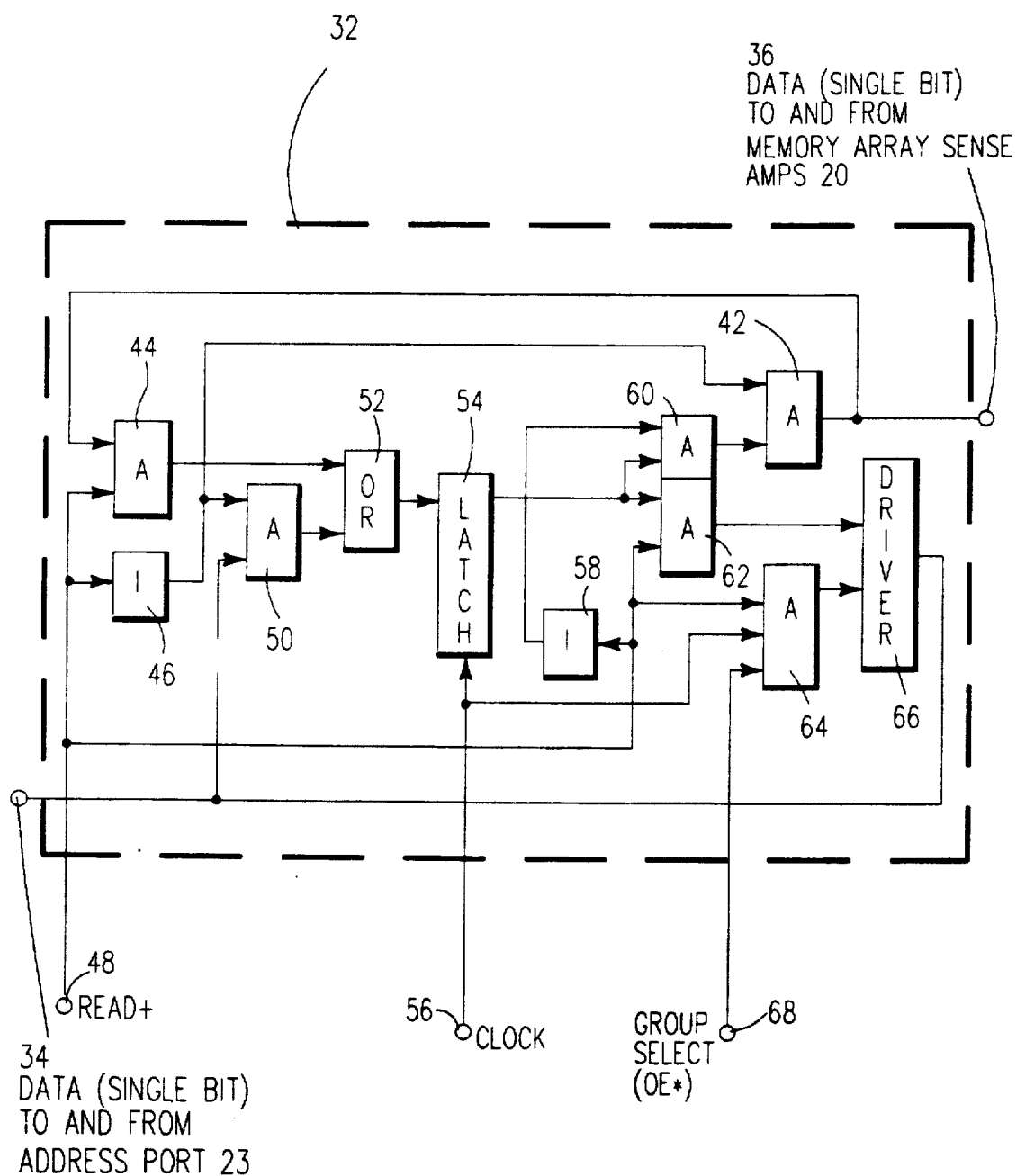
FIG. 5 is a logic circuit diagram of one embodiment of a buffer logic macro 32 of FIG. 4.

The internal structure of data buffer 24 is shown in greater detail in FIGS. 4 and 5. In FIG. 4, it is seen that data buffer 24 comprises a plurality of buffer logic macro circuits 32, labelled as 1,2, . . . N. Each buffer logic macro 32 is a bidirectional logic circuit capable of handling one bit of information through data terminals, such as terminals 34 and 36. Buffer lines 17A, coupled to the data terminals 34, are connected to transmit data signals to and from the address port (and alternate data port) 23. On the other side, each data terminal 36 transmits or receives a single data signal bit at a time to and from the memory array sense amps 20 over data lines 40. The READ, CLOCK and GROUP SELECT lines 48, 56 and 68, respectively, are coupled in parallel to all of the buffer logic macros 32, as shown. In this manner, data buffer 24 may serve as a bidirectional device capable of passing data words of width N to and from memory array 19 and to and from port 23.

A specific logic circuit comprising each buffer logic macro 32 of FIG. 4 is shown in FIG. 5. In a preferred embodiment of the present invention, each logic circuit 32 comprises a plurality of AND gates, an OR gate, inverters, a latch and a driver, to perform latching, gating and driving functions for individual bits of data words flowing back and forth through the circuit via data terminals 34 and 36, which correspond to the same terminals as shown in FIG. 4. In the circuit 32 of FIG. 5, there are shown six AND gates, designated by reference numerals 42, 44, 50, 60, 62 and 64, respectively. Each AND gate has two inputs and one output, except for AND gate 64, which may have three inputs if the optional GROUP SELECT line 68 is used. Circuit 32 also contains one OR gate 52 having two inputs and one output; two inverters 46 and 58, each having one input and one output; a latch 54 having one data input, one clock input and one output; and a driver 66, having two inputs and one output. Three control terminals for receiving the READ, CLOCK and GROUP SELECT lines 48, 56 and 68, complete the logic circuit.

In a preferred embodiment, the gates and other elements of the logic circuit 32 of FIG. 5 are interconnected in the following way:

data terminal 34 is coupled to the first input of AND gate 50 and to the output of driver 66;

data terminal 36 is coupled to the first input of AND gate 44 and to the output of AND gate 42;

data READ line 48 is coupled to the second input of AND gate 44, to the first input of AND gate 62 and to the first input of AND gate 64, and is coupled through inverter 46 to the first inputs of AND gates 50 and 42, and is coupled through inverter 58 to the first input of AND gate 60;

CLOCK line 56 is coupled to a second input of AND gate 64 and to an input of latch 54, the other input of the latch being coupled to the output of OR gate 52;

GROUP SELECT line 68 is coupled to the third input of AND gate 64;

the inputs of OR gate 52 are coupled, respectively, to the outputs of AND gates 50 and 44, respectively;

the second inputs of AND gates 62 and 60, respectively, are coupled to the output of the latch 54;

the second input of AND gate 42 is coupled to the output of AND gate 60; and the inputs of the driver 66 are coupled to the outputs of AND gates 62 and 64, respectively.

Figure 1:
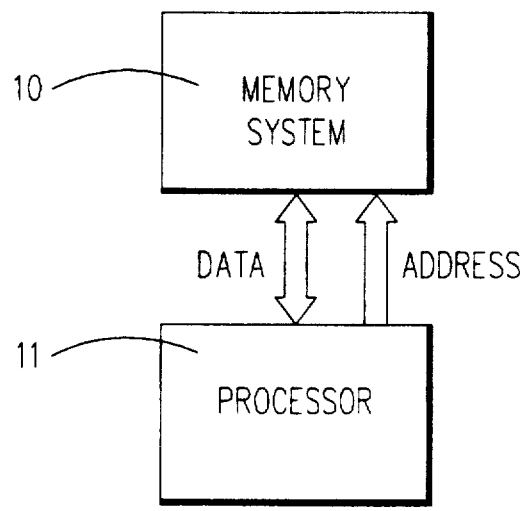
FIG. 1 is a block diagram of a typical prior art memory system.
Figure 7:
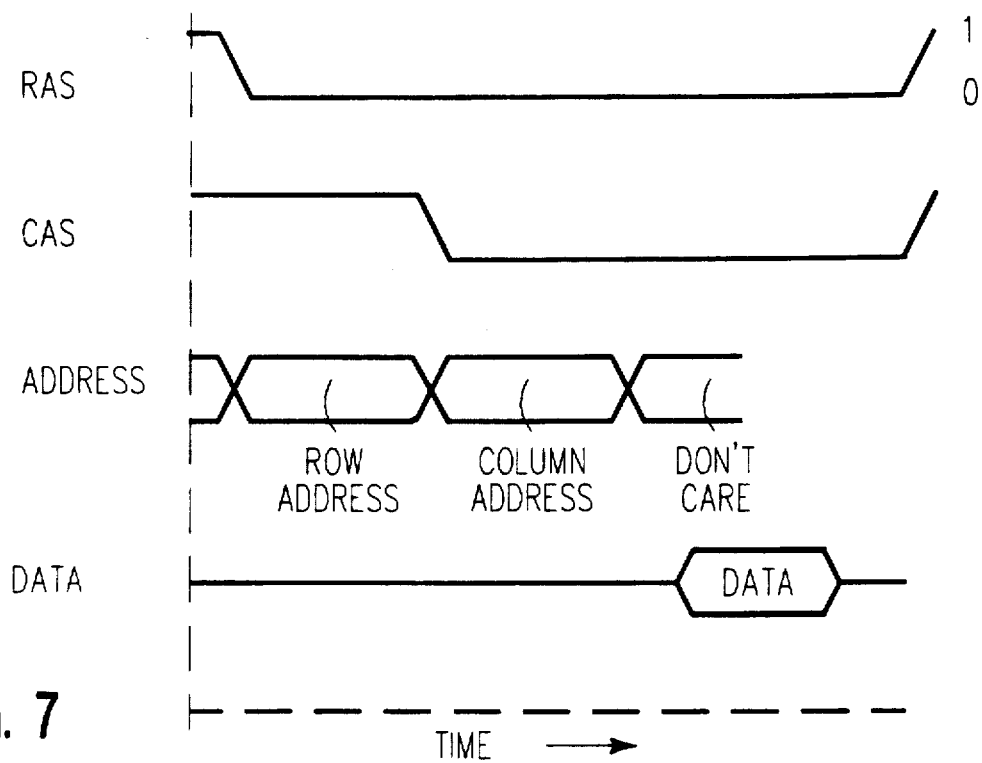
FIG. 7 is a timing diagram showing the operation of a typical prior art memory circuit.

The operation of one embodiment of the present invention will now be described. It is, however, instructive to first examine the operation of a typical prior art memory circuit. Turning first to FIG. 7, there is shown therein a timing diagram of the timing relationship of various signals as they pass to and from a memory array from a processor, such as the arrangement of FIG. 1. In FIG. 7, five different signals are applied to a typical prior art memory array in order to accomplish a data read or a data write operation. These signals, which are sent to the array from the processor or support logic over four different lines or groups of lines (buses), consist of a row address strobe (RAS) signal, a column address strobe (CAS) signal, a row address selection signal, a column address selection signal, and a data signal. The address selection signals permit a particular row or column of cells to be selected, and the address strobe signals cause the address decoders to actually transmit the selection signals to the array for cell selection (addressing).

In a data read operation, the time sequence of these various signals will typically be as follows: First, the particular row address select information will be input to the row address decoder which will decode the information for the selection of the particular row in which the memory cell desired to be read is located. At or about the same time, the RAS signal will become active or change state to enable the row address decoder to activate the particular row. Thereafter, the separate column address select signal will be sent over the address lines to the column address decoder for determining the particular column of the memory cell. At or about the same time, the CAS signal will become active or change state to activate all of the cells in that particular column. Then, the particular memory cell to be read will be activated and will output its stored bit information over the data lines into the sense amp and thereafter out of the array. A similar sequence of addressing operations is performed during a write operation, but the data operations are, of course, reversed.

Figure 8:
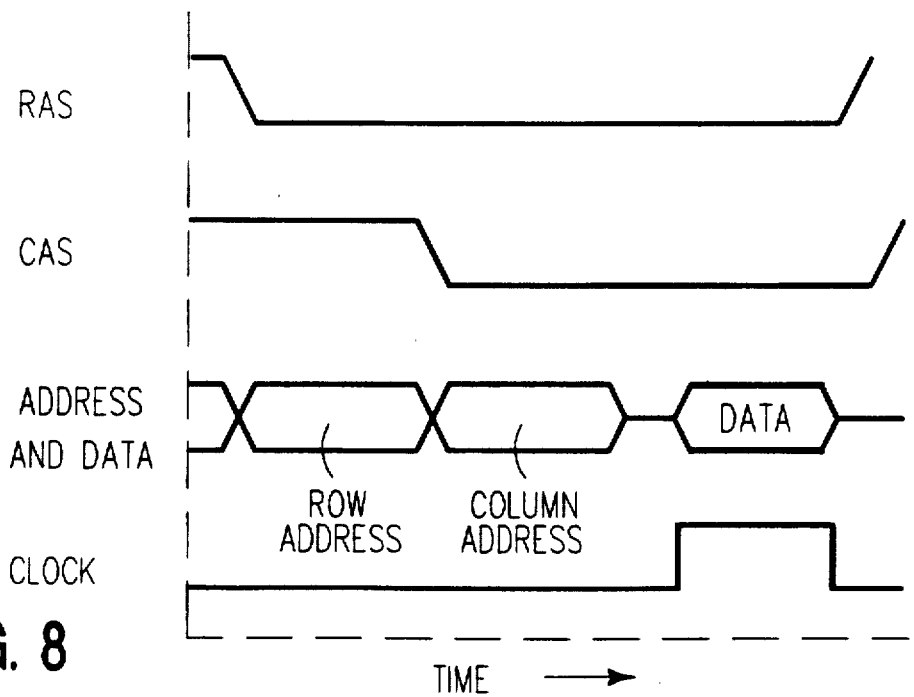
FIG. 8 is a timing diagram showing the operation of an individual memory chip of the present invention.

As mentioned previously, a feature of the present invention is its ability, through the use of the data buffer 24, to handle data signals which have been triplexed with row address and column address signals on one bus, the bus being coupled to the memory array chip by one port. The operation of such an arrangement is shown in FIG. 8, which may be viewed in conjunction with FIG. 3. In FIG. 8, the RAS and CAS signals are applied successively to the row address decoder 26 and column address decoder 28 of the present invention. These signals are generated by support logic element 30 (FIG. 3). As shown in FIG. 8, there is no separate data line supplying data signals. Instead, the timing relationship for the row address signals, column address signals and data signals is shown for a triplexed address/data line. Because of the special timing relationship and the operation of data buffer 24, the data signals may be passed to and from array 19 without interference with the row address or column address signals.

The triplexed row, column and data signals of FIG. 8 represent the signals transmitted over a particular one of the address lines 17 (FIG. 3), and input to a data terminal 34 of buffer 24 over a particular one of buffer lines 17A (FIGS. 4 and 5. These signals are normally clocked. The signals at the other data terminals 36 of the data buffer 24 (FIGS. 4 and 5) are, however, only data signals. Although address signals are being fed into data buffer 24, these address signals have no effect on the data being stored in or read from the array because of the particular timing relationship that is employed with the present invention. Similarly, although data signals are being fed into decoders 26 and 28, they have no effect on the addressing of the array because, again, of the particular timing relationship of the present invention. For example, the RAS and CAS signals permit addressing only during the designated address portions of the memory cycle. In this way, data buffer 24 performs blocking functions for the address on a memory write cycle, and performs blocking, gating and driving functions for the data on a memory read cycle. Data is blocked or prevented from flowing through the data buffer and into or out of the memory array at certain points of the memory cycle in order to permit all three of the signals (row address, column address and data) to utilize the same group of lines and hence the same address port and alternate data port 23.

Figure 6:
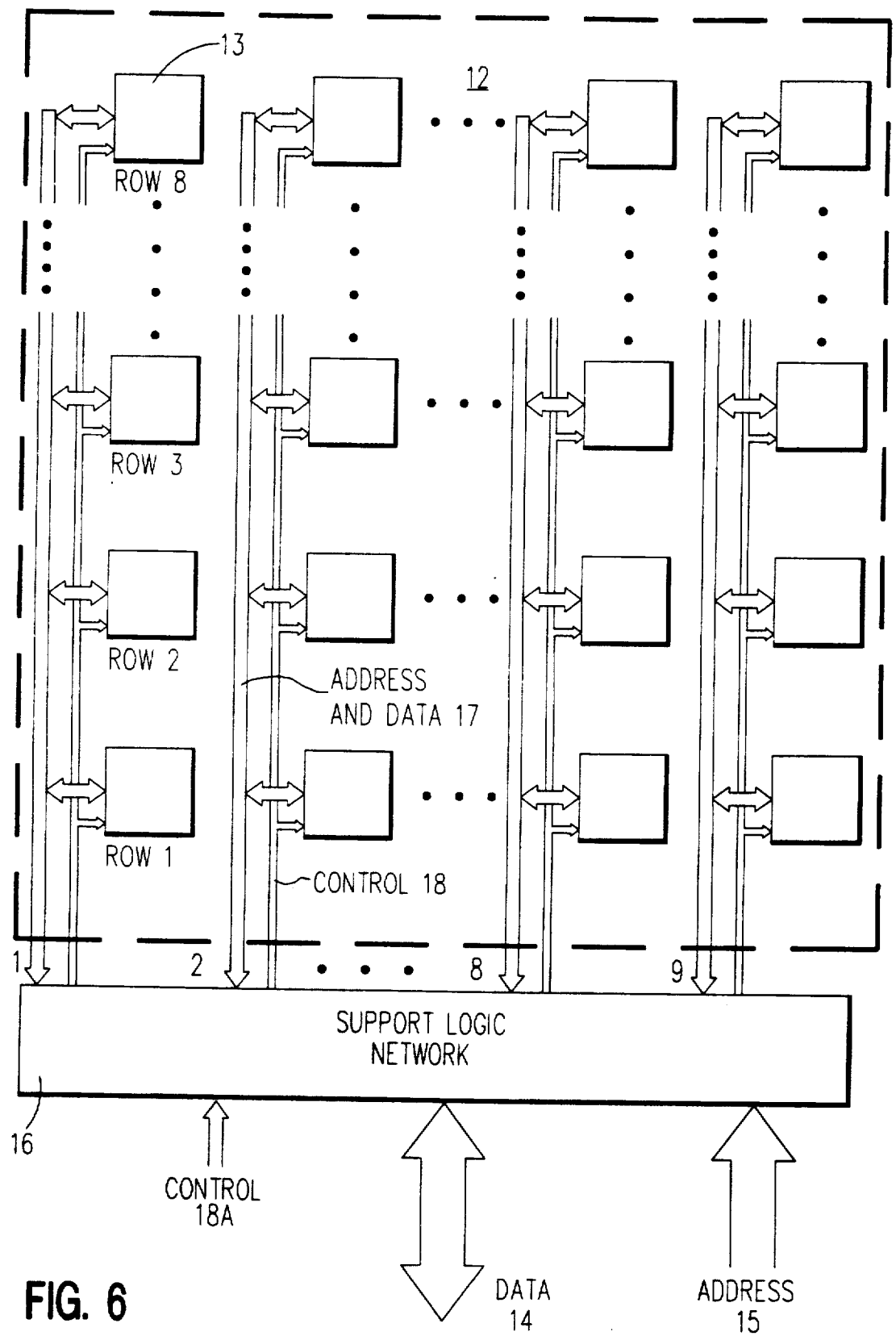
FIG. 6 is a block diagram of a memory chip group 12 of FIG. 2.

The operation described above is the operation of the memory and address signal transfer to and from a single memory chip. The present invention may, however, also be used in large memory organizations employing numerous chips organized into groups. As described previously, a plurality of such groups 12 is shown in FIG. 2. The arrangement of the chips 13 within a particular group is shown in greater detail in FIG. 6, which, for example, may be memory chip group 1A of FIG. 2. In a specific embodiment, as shown in FIG. 6, there are 72 individual memory array chips 13 organized into an array of nine columns and eight rows. The address and data bus 17 communicates with all of the chips to provide address and data information. (Although nine address and data lines are shown for convenience, all of these are actually part of one bus that attaches to one I/O port in support logic network 16.) A separate control bus 18 also communicates with all the chips to provide control information (such as read data, clock, group select, row address strobe and column address strobe). Information is supplied through these buses from support logic network 16, which comprises a plurality of support logic elements 30 (see FIG. 3). Support logic network 16 communicates, in turn, with a processor (not shown) through data bus 14, address bus 15 and control bus 18A. Additional control lines may also be present, as well as power lines (not shown).

The operation of the memory chip group 12 of FIG. 6 is shown in the timing diagrams of FIGS. 9 and 10. FIG. 9 represents a "fetch'or 'read" operation and FIG. 10 illustrates a "store" or "write" operation. It is instructive to view FIGS. 3 and 6 together with FIGS. 9 and 10. In the "fetch" operation of FIG. 9, the row address selection signals and column address selection signals, are, sequentially, transmitted to all of the chips in a particular row simultaneously, together with the appropriate RAS or CAS signals. During this addressing phase, the read signal is active and no clock signals need to be given. Once the particular row and column have been selected, the CLOCK line 56 (FIG. 3) may be activated sequentially and sent over control bus 18 (FIG. 6) to all of the chips having the same row addresses. Each clock pulse will then read out data words from an entire row of chips one row at a time, as shown by the "row 1 data," "row 2 data," etc., signals in FIG. 9. The "write" operation is similar, except that data is first latched in the data buffer, and then the cells are addressed. In this way, an entire series of rows of data words may be successively read out of or into the array over the same address and data lines 17 that are used to address the chips. Since no separate data lines are required, there is no need for any additional I/O circuits in the support logic network 16 of FIG. 6. Numerous groups of the type of FIG. 6 may be combined into an overall network or memory organization, as shown in FIG. 2. The dedicated address ports of each chip are, however, available in the event the alternate data ports are not used.

In this way, a highly convenient and cost-effective memory array design can be achieved, which provides the flexibility to use the same memory chip for either dual-port, high-speed or single-port, low-cost applications.

While the invention has been particularly shown and described with reference to the preferred embodiments thereof, it will be understood by those skilled in the art that various changes in form and detail may be made therein without departing from the spirit and scope of the invention.

I claim:

1. A memory organization comprising:
  a plurality of memory arrays, each array having a data port adapted to pass data signals to and from the array, a separate address/data port larger than the data port and adapted to pass data signals to and from the array and to pass row and column address signals to the array, and at least one separate control port for receiving control signals;
  bidirectional data buffer means coupled to each array and the address/data port for separating the data signals from the address signals and sending data signals to the array during a memory write operation and for receiving the data signals from the array and sending data signals through the address/data port during a memory read operation, interspaced between each pair of row and column address signals so as to avoid interference with the address signals; and
  logic means for applying control signals to the data buffer means so as to control the memory write and read operations and to control the selection of a particular array.

2. The memory organization of claim 1 in which each array comprises an array of random access memory cells.

3. The memory organization of claim 1 in which each array is contained on a signal integrated circuit chip together with the data port, address/data port, control port and data buffer.

4. The memory organization of claim 1 in which the data buffer means comprises a plurality of logic circuits operating in parallel and arranged to latch, gate and drive the data signals to and from the array and through the address/data port interspaced between with the row and column address signals and in response to the control signals.

5. A memory chip comprising:
- a memory array to which is coupled a plurality of data lines and a plurality of address lines;
- a first port and a second port;
- input/output means coupled to the data lines for sending and receiving data through the first port;
- an address/data bus having a number of lines greater than or equal to the number of data lines and coupled to the data lines and to the address lines, the address/data bus being arranged to receive a stream of row and column address signals and to send and receive a stream of data signals through the second port; and
- bidirectional data buffer means contained on the chip and coupled to the address/data bus for blocking and directing such data signals, in timed relationship with the address signals, to the memory array during a memory write operation and for blocking and directing data signals read from the array to the address/data bus, in timed relationship with the address signals, during a memory read operation.

6. The memory chip of claim 5 in which each array comprises an array of dynamic random access memory cells.

7. The memory chip of claim 5 in which the data buffer means comprises a plurality of logic circuits operating in parallel and performing data latching, data gating and data driving functions in response to control signals.

8. A memory circuit comprising:
- an array of memory cells;
- row and column address decoders coupled to the array and suitable for sending row and column address information to the array;
- data sense amplifiers coupled to the array and suitable for sending and receiving data to and from the array;
- data lines coupled to the sense amplifiers;
- a data input/output interface coupled to the data lines and suitable for sending and receiving data signals to and from external circuitry through a dedicated data port;
- address lines coupled to the address decoders, suitable for receiving address signals from external circuitry through an address port, the number of address lines being greater than the number of data lines; and
- a bidirectional data buffer coupled to and situated between the address lines and the data lines, arranged to permit the address port to function both as an address port and as an alternate data port capable of passing data words having a larger number of bits than data words passable only through the dedicated data port, and suitable for blocking, sending and receiving data signals to and from external circuitry over the address lines in timed relationship with the row and column address signals, in response to control signals.

9. The memory circuit of claim 8 in which each memory cell comprises a dynamic random access memory cell.

10. The memory circuit of claim 8 in which the data buffer comprises a plurality of bidirectional single-bit logic circuits operating in parallel and performing data latching, data gating and data driving functions in response to control signals.

11. The memory circuit of claim 10 in which each bidirectional single-bit logic circuit comprises:
- a first data terminal (34) coupled to an input of a first AND gate (50) and to an output of a driver (66);
- a second data terminal (36) coupled to an input of a second AND gate (44) and to an output of a third AND gate (42);
- a data read line (48) coupled to inputs of the second AND gate (44), a fourth AND gate (62) and a fifth AND gate (64), and coupled through a first inverter (46) to inputs of the first (50) and third (42) AND gates, and coupled through a second inverter (58) to an input of a sixth AND gate (60);
- a clock line (56) coupled to an input of the fifth AND gate (64) and to an input of a latch (54), the latch having another input coupled to an output of an OR gate (52);
- a group select line (68) coupled to an input of the fifth AND gate (64);
- the OR gate (52) having inputs coupled to outputs of the first (50) and second (44) AND gates, the fourth (62) and sixth (60) AND gates each having inputs coupled to an output of the latch (54), the third AND gate (42) having an input coupled to an output of the sixth AND gate (60), and the driver (66) having inputs coupled to outputs of the fourth (62) and fifth (64) AND gates, respectively.

* * * * *